(12) United States Patent
Van Der Pasch et al.

(10) Patent No.: US 8,570,492 B2
(45) Date of Patent: Oct. 29, 2013

(54) LITHOGRAPHIC APPARATUS

(75) Inventors: Engelbertus Antonius Fransiscus Van Der Pasch, Oirschot (NL); Emiel Jozef Melanie Eussen, Eindhoven (NL); Johannes Henricus Wilhelmus Jacobs, Heeze (NL); Joost Jeroen Ottens, Veldhoven (NL); Frank Staals, Eindhoven (NL); Lukasz Jerzy Macht, Eindhoven (NL); William Peter Van Drent, Best (NL); Erik Willem Bogaart, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 64 days.

(21) Appl. No.: 13/414,352

(22) Filed: Mar. 7, 2012

(65) Prior Publication Data

US 2012/0242969 A1 Sep. 27, 2012

Related U.S. Application Data

(60) Provisional application No. 61/450,929, filed on Mar. 9, 2011.

(51) Int. Cl.
*G03B 27/58* (2006.01)
*G03B 27/42* (2006.01)

(52) U.S. Cl.
USPC .............................................. 355/72; 355/53

(58) Field of Classification Search
USPC .................. 355/53, 55, 72–76; 356/399–401
See application file for complete search history.

(56) References Cited

U.S. PATENT DOCUMENTS 7,633,619 B2 * 12/2009 Kwan ............................ 356/401
8,294,878 B2 * 10/2012 Ichinose ......................... 355/72
2011/0007291 A1 1/2011 Ichinose

FOREIGN PATENT DOCUMENTS

| JP | 2011-061128 | 3/2011 |
| WO | 2010/032878 | 3/2010 |
| WO | 2011/062297 | 5/2011 |

* cited by examiner

*Primary Examiner* — Hung Henry Nguyen
(74) *Attorney, Agent, or Firm* — Pillsbury Winthrop Shaw Pittman LLP (57) ABSTRACT

A lithographic apparatus including a substrate table position measurement system and a projection system position measurement system to measure a position of the substrate table and the projection system, respectively. The substrate table position measurement system includes a substrate table reference element mounted on the substrate table and a first sensor head. The substrate table reference element extends in a measurement plane substantially parallel to the holding plane of a substrate on substrate table. The holding plane is arranged at one side of the measurement plane and the first sensor head is arranged at an opposite side of the measurement plane. The projection system position measurement system includes one or more projection system reference elements and a sensor assembly. The sensor head and the sensor assembly or the associated projection system measurement elements are mounted on a sensor frame.

20 Claims, 3 Drawing Sheets

LITHOGRAPHIC APPARATUS

This application claims priority and benefit under 35 U.S.C. §119(e) to U.S. Provisional Patent Application No. 61/450,929, filed on Mar. 9, 2011. The content of that application is incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

WO 2010/032878 discloses a lithographic apparatus comprising a sensor head configured to determine the position of a substrate table of the lithographic apparatus. The sensor head is arranged on a sensor arm extending under the substrate table. The sensor arm is rigidly mounted on the metrology frame of the lithographic apparatus. The substrate table of the lithographic apparatus comprises a holding device to hold a substrate in a holding plane. The substrate table further comprises a grid plate extending in a measurement plane parallel to the holding plane. The grid plate is arranged below the holding device, such that the sensor head arranged on the sensor arm can cooperate with the grid plate to measure a position of the substrate table.

A drawback of the position measurement system of WO 2010/032878 is that the position measurement system may be sensitive for dynamic movements and thermal influences, which may result in inaccurate position measurement. Inaccurate position measurement may result in exposure errors such as focus and overlay errors, and is therefore undesirable.

SUMMARY

It is desirable to provide a lithographic apparatus comprising a position measurement system for accurate position measurement of the substrate table.

According to an embodiment of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table comprising a holding device to hold a substrate in a holding plane; a projection system configured to project, when the substrate table is positioned in an exposure area, the patterned radiation beam onto a target portion of the substrate, and a substantially vibration isolated frame supporting the projection system, wherein the lithographic apparatus comprises a substrate table position measurement system to measure a position of the substrate table, wherein the substrate table position measurement system comprises a substrate table reference element arranged on the substrate table, and a first sensor head to determine a position of the first sensor head with respect to the substrate table reference element, wherein the substrate table reference element extends in a measurement plane substantially parallel to the holding plane, and wherein the holding plane is arranged at one side of the measurement plane and the first sensor head is arranged, when the substrate table is in the exposure position, at an opposite side of the measurement plane, wherein the lithographic apparatus comprises a sensor frame mounted on a sub-frame of the lithographic apparatus and wherein the first sensor head is mounted on the sensor frame, wherein the lithographic apparatus comprises a projection system position measurement system to measure a position of the projection system, comprising at least one projection system reference element and a sensor assembly to determine a position of the sensor assembly with respect to the projection system reference elements, and wherein one of the sensor assembly and the at least one projection system reference element is mounted on the projection system, and the other of the sensor assembly and the at least one projection system reference element is mounted on the sensor frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
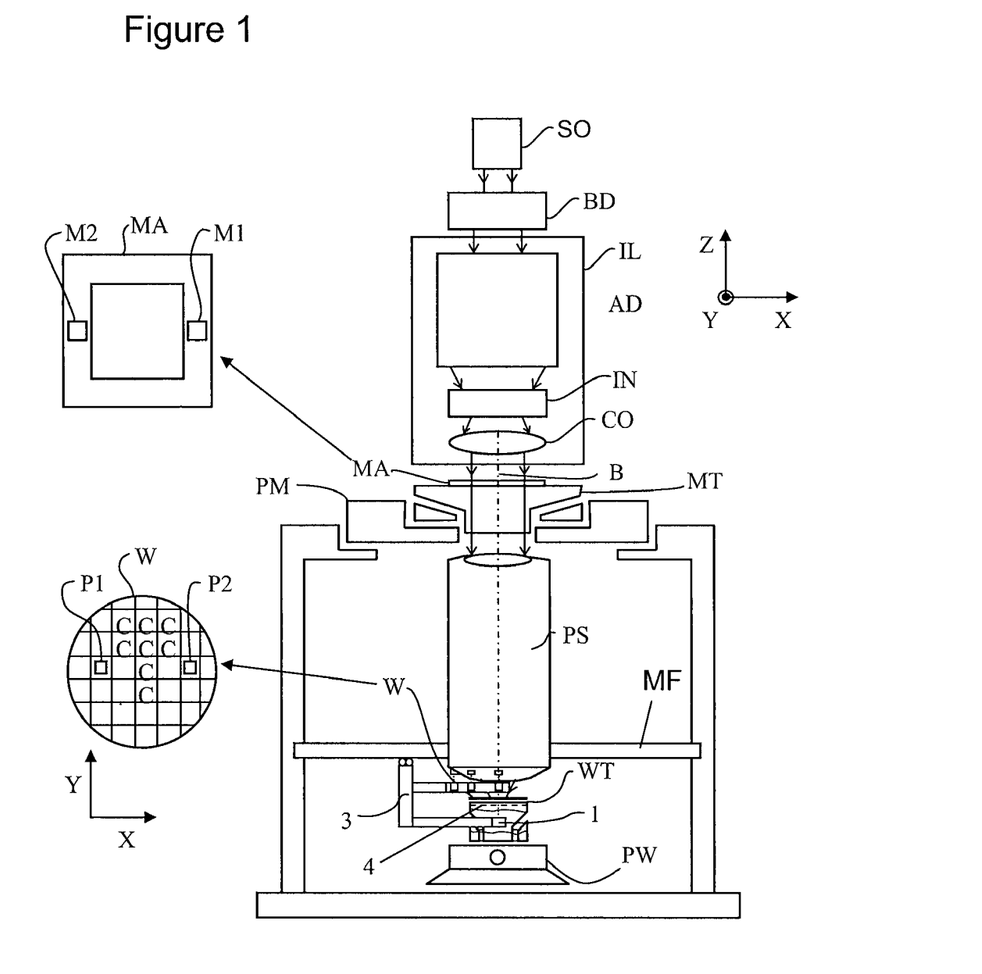
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support supports holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports". In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support MT (e.g., mask table), and is patterned by the patterning device. Having traversed the patterning device (e.g. mask) MA, the radiation beam B passes through the projection system PS, which focuses the beam onto a target portion C of the substrate W. With the aid of the second positioning device PW and a substrate table position measurement system comprising a sensor head 1 mounted on a sensor frame 3 and a grid plate 4 mounted on the substrate table WT, the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
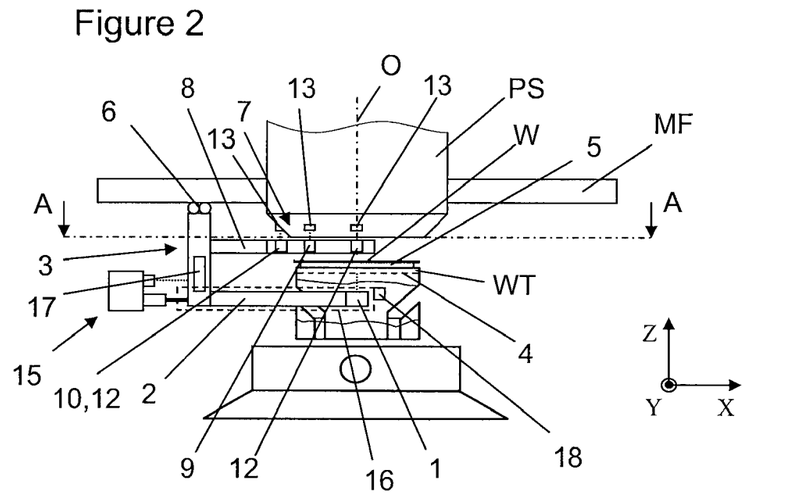
FIG. 2 depicts the sensor frame with sensor head and sensor assembly in more detail according to an embodiment of the invention.
Figure 3:
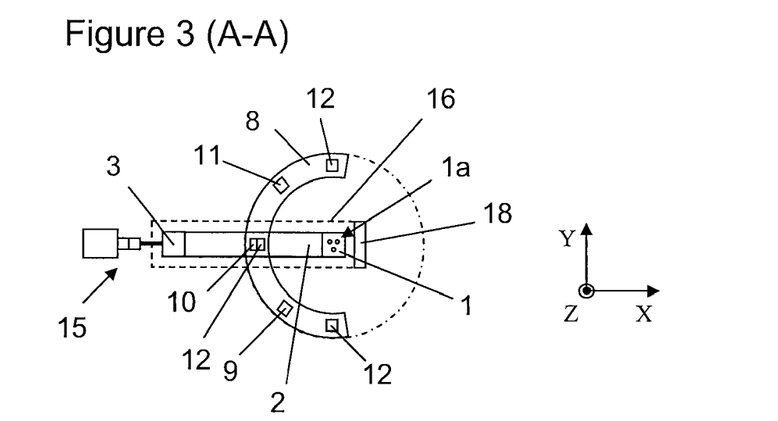
FIG. 3 depicts schematically a top view of the cross section A-A of FIG. 2.

FIGS. 2 and 3 show the substrate table position measurement system according to an embodiment of the invention.

The substrate table position measurement system comprises a sensor head 1 which is arranged on a first arm 2 of a sensor frame 3. The sensor head 1 is configured to cooperate with a substrate table reference element in the form of a grid plate 4 arranged at a bottom side of the substrate table WT. The substrate table WT comprises a holding device or holder 5, for example a vacuum clamp, to hold the substrate W in a holding plane. The grid plate 4 extends in a measurement plane substantially parallel to the holding plane. Any other substrate table reference element capable of cooperating with the sensor head 1 to determine the position of the substrate table WT may also be applied.

The sensor head 1 is configured to determine the position of the substrate table WT in six degrees of freedom. Therefore, the sensor head 1 comprises a first and a second encoder sensor to measure a position in a first direction in the measurement plane, for example the x-direction, and a third encoder sensor to measure a position in a second direction in the measurement plane substantially perpendicular to the first direction, for example the y-direction. The sensor head 1 comprises three interferometer sensors to measure a position in a direction substantially perpendicular to the measurement plane, for example the z-direction.

In the embodiment of FIGS. 2 and 3, the sensor head 1 comprises three measurement sensors 1a, each combining one of the encoder sensors and one of the interferometer sensors. The distance between the individual measurement sensors 1a may for instance be in the range of the dimensions of a die on the substrate W resulting in a sensor head 1 with a relative small measuring area to measure the position of the substrate table WT in six degrees of freedom.

In an embodiment, the sensor head 1 is arranged on the optical axis O of the lithographic apparatus. As a result, the sensor head 1 can measure the position of the grid plate 4 at a location very close to the location where, during exposure, a projection beam B is projected on the substrate W supported on the substrate table WT. In this way the position of the target location of the substrate, i.e. where the projection beam B is projected on the substrate W, can be relatively accurately determined and used for position control of the substrate W on the substrate table WT. Also, position measurement at this location results in low sensitivity with respect to deformations in the substrate stage.

Since the sensor head 1 is arranged at an opposite side of the measurement plane with respect to the holding plane of the holding device or holder 5, the sensor head 1, although arranged on the optical axis O, does not interfere with the projection of the patterned radiation beam on the substrate W.

In an embodiment, the sensor frame 3 is manufactured from lightweight material with low thermal expansion coefficient, for instance Zerodur. Furthermore, the sensor frame 3 has a lightweight construction with relative high stiffness.

The lowest resonance frequency of the sensor frame 3 is at least 400 Hz, and in an embodiment, at least 600 Hz. Such relative high level of the lowest resonance frequency is in this example obtained by constructing the sensor frame 3 lightweight and relatively stiff.

The sensor frame 3 is mounted on the metrology frame MF. This metrology frame 3 is a substantially vibration isolated frame, i.e. a substantially stationary frame, to which the projection system PS is mounted. It is remarked that a substantially stationary frame may be any frame which is passively or actively held in a substantially stationary position. The metrology frame 3 of the lithographic apparatus is mounted with passive or active air-mounts on a base frame to filter any external disturbances such as vibrations in the factory floor. In this way the projection system PS and the sensor frame 3 are held in a substantially stationary position.

However, some movements may still be present in the metrology frame, for instance bending modes of the metrology frame typically in a frequency range of 150-200 Hz. Other movements of the metrology frame may also influence the measurement quality of the substrate table position measurement system.

To make the sensor frame 3 less sensitive to movements of the metrology frame, the sensor frame 3 is kinematically mounted in six degrees of freedom on the metrology frame MF of the lithographic apparatus using a statically non-undetermined construction, i.e. the construction is not under determined or over determined. In the shown embodiment a statically determined (i.e. non-under determined and non-over determined) leaf spring construction 6 is used to mount the sensor frame 3 on the metrology frame MF.

Since the lowest resonance frequency of the sensor frame (>400 Hz) is substantially higher than the typical resonance frequencies of the metrology frame (150-200 Hz), and the sensor frame 3 is isolated from the resonance vibrations of the metrology frame MF by the leaf spring construction 6, the performance of the substrate table position measurement system is substantially improved.

It is desirable for good image quality that focus and imaging errors are small. For controlling these focus and imaging errors, it is desirable to control the position of the substrate table with respect to the projection system PS, preferably independent of movements of the metrology frame. For this reason, a sensor assembly 7 is mounted on a second arm 8 of the sensor frame 3, so that the position of the substrate table WT and the projection system PS with respect to each other can be accurately be determined. The sensor arm 8 is partly annular to measure the position with respect to an outer rim of the projection system PS. On the basis of these measurements the position of the projection system at the optical axis O can be determined.

The sensor assembly 7 is configured to determine the position of the projection system PS in six degrees of freedom. The sensor assembly 7 comprises a first position sensor 9 and a third position sensor 11 to measure a position of the projection system PS in a radial direction with respect to the optical axis O of the projection system, and a second position sensor 10 to measure a position of the projection system PS in a tangential direction with respect to the optical axis O of the projection system PS. The sensor assembly 7 further comprises three position sensors 12 to measure a position of the projection system PS in a direction substantially parallel to the optical axis O of the projection system, i.e. in z-direction.

The position sensors 9, 10, 11 and 12, may for instance be encoder-type sensors, interferometers and/or capacitive sensors, and are configured to determine a position with respect to reference elements 13, for instance small mirror elements or grid plates, arranged on an outer rim of the bottom end of the projection system PS. In alternative embodiments, any other suitable type of sensors and reference elements may also be used. The reference elements may for example also be formed by the projection system itself.

Since the sensor assembly 7 and the sensor head 1 are mounted on the sensor frame 3, the relative position of the substrate table WT with respect to the projection system PS can be measured with high accuracy.

It is remarked that in an alternative embodiment the sensor assembly 7 may be mounted on the projection system PS, and the projection system reference elements 13 may be mounted on the sensor frame 3.

The quality of the position measurement may be influenced by resonance frequencies in the sensor arm itself, position changes in the sensor arm 3 due to sensor frame deformations caused by air pressure forces resulting from movements of the substrate table WT, thermal effects in the sensor frame 3, for instance caused by local heating, and disturbances in the measurement beams due to thermal effects in the area between sensor head 1 and the gird plate 4.

The following measures may be taken to decrease or even take away these effects.

Although the lowest resonance frequencies of the sensor frame 3 are substantially higher than the lowest resonance frequencies of the metrology frame MF, these resonance frequencies of the sensor frame 3 may still influence position measurement. To decrease the effect of resonance frequencies of the sensor frame 3 itself, an active damping device or active damper 15 is provided to damp movements of the sensor frame 3. This active damping device or active damper 15 may be configured as any damping device or damper 15 capable of suppressing the movements of the sensor frame 3. As an alternative, or in addition thereto, a passive damping device may be provided to damp movements of the sensor arm 3. Such a passive damping device may be a tuned mass damper for suppressing one or more resonance peaks of the sensor frame 3. Alternatively or additionally, an eddy current based damper may be used.

The movement of the substrate table WT for instance during scanning movements of the substrate table may cause pressure waves which propagate in the area where the sensor head 1 is provided. Also at other locations pressure waves may be present during the use of the lithographic apparatus which may act on the sensor frame 3, or parts thereof. To decrease the influence of the pressure waves one or more shielding frames comprising shielding material at least partially enclosing the sensor frame 3 may be provided. In the exemplary embodiment of FIGS. 2 and 3 a shielding frame 16 is provided which encloses the sensor arm 2 and the sensor head 1. Additional shielding frames may be provided for other parts of the sensor frame 3 and/or the sensor assembly 7.

Additionally or alternatively, the sensor frame 3 may have an aerodynamic design to minimize the influence of pressure waves.

In an embodiment, the one or more shielding frames 16 are not mounted on the sensor frame and/or the metrology frame, since pressure wave forces will be exerted on these shielding frames 16. The one or more shielding frames 16 may for instance be mounted on a base frame of the lithographic apparatus, i.e. a non-vibration isolated frame of the lithographic apparatus.

The thermal conditions within the sensor frame 3 may also have an influence on the relative position between the sensor head 1 and the sensors of the sensor assembly 7. These relative positions should be kept constant to obtain a reliable position measurement of the substrate table WT with respect to the projection system PS. To control the effects caused by thermal effects within the sensor frame 3, one or more thermal conditioning devices or thermal conditioners 17 may be provided to control thermal condition of the sensor frame 3. These thermal conditioning devices or thermal conditioners 17 may, for example, comprise water heating/cooling conduits, local heaters which may be electric, or such. The thermal conditioners 17 may comprise temperature controlled liquids and/or gasses. The thermal conditioners 17 may comprise peltier-elements or heat-pipes to transport heat. The thermal conditioning devices or thermal conditioners 17 may be mounted on the sensor frame 3 or on any other suitable location, for example a shielding frame 16. A temperature sensor may be located in or on the sensor frame 3 to acquire an accurate temperature.

As explained above thermal conditions in the measurement beam area, i.e. between the sensor head 1 and the grid plate 4 may cause disturbances in the measurement. One or more air conditioning devices or air conditioners 18 to provide a conditioned air flow in a measurement area of measurement beams of the sensor head 1. Similarly air conditioning devices 18 may be provided to condition the area wherein the measurement beams of the position sensors 9, 10, 11, 12 of the sensor assembly run. The air conditioning devices 18 may be located on at least one of the sensor frame 3, the metrology frame MF and the base frame.

The one or more air conditioning devices 18 may be mounted on any suitable location, for instance the shielding frame 16. It is remarked that when the measurement beam run through a conditioned environment, for instance a partially vacumized environment, the air conditioning devices 18 may be used to condition this conditioned environment.

FIGS. 2 and 3 show the sensor frame 3 to measure the position of a substrate table WT in the exposure area of the lithographic apparatus, i.e. where a patterned projection beam B is projected on the substrate W.

The sensor frame 3 of the invention may also be provided in the measurement area of the lithographic apparatus. Before actual exposure of patterns on the substrate W, the surface of the substrate W is scanned by an alignment sensor and a focus sensor to measure the surface of the substrate W. This information is used during the exposure phase to optimize the alignment and focus of the substrate surface with respect to the projection system.

Figure 4:
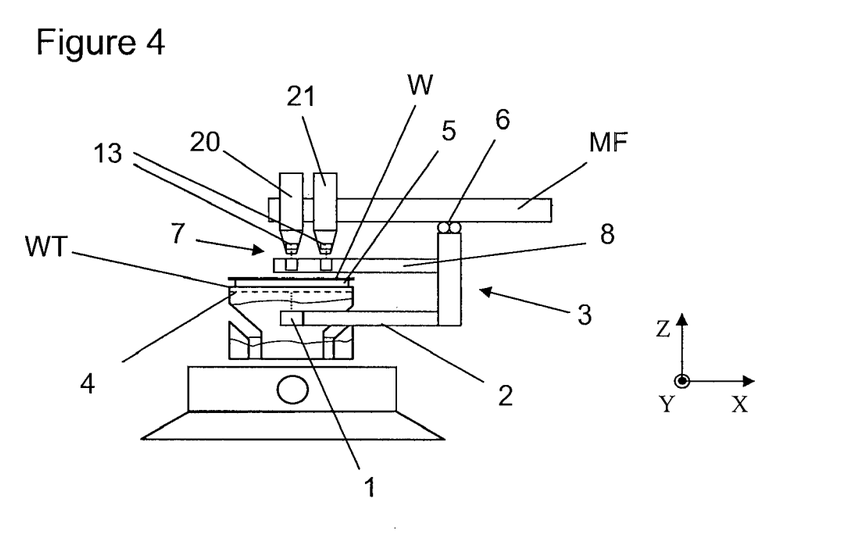
FIG. 4 depicts a second sensor frame with sensor head and sensor assembly for the measurement area of the lithographic apparatus according to an embodiment of the invention.

FIG. 4 shows the sensor frame 3 arranged in such measurement range. The same parts or parts having substantially the same function are provided with the same reference numerals. It is remarked that in the lithographic apparatus, the measurement area and the exposure area may be located close to each other, preferably adjacent to each other.

On the metrology frame MF, an alignment sensor 20 and a focus sensor 21 are arranged to perform alignment and focus measurements. A second sensor frame 3 is kinematically mounted on the metrology frame MF with a statically determined (i.e. non-under determined or non-over determined) leaf spring construction 6. The second sensor frame 3 comprises a first sensor frame arm 2 and a second sensor frame arm 8. On the first sensor frame arm 2, a second sensor head 1 is mounted to determine a position of the substrate table WT with respect to the sensor frame 3. On the second sensor frame arm 8 a second sensor assembly 7 is mounted to determine positions of the alignment sensor 20 and the focus sensor 21 with respect to the sensor frame 3. Reference elements 13 are mounted on the alignment sensor 20 and the focus sensor 21 to cooperate with the sensor assembly 7.

With the second sensor frame 3, the second sensor head 1 and the second sensor assembly 7, a reliable measurement of the relative position between the substrate table WT and the alignment sensor 20 and the focus sensor 21 can be obtained.

It is remarked that similar to the embodiment of FIGS. 2 and 3, the sensor frame 3 may be provided with further measures to optimize the measurement performance, such as active or passive damping devices, one or more shielding frames, one or more thermal conditioning devices for the sensor frame 3, and one or more air conditioning devices to condition the air in the area of the measurement beams.

In the embodiments described above, the substrate table reference element may be made of the same material as the substrate table, or as at least the part of the substrate table. This part may be the part that exists between the substrate table reference element and the top surface of the substrate table that requires high position accuracy. This has the benefit that thermal deformation of the substrate table can be measured with the substrate table reference element. Also thermal deformations that have horizontal gradients or which vary over time may be measured. When the substrate table expands due to an increased temperature, the substrate table reference element expands in the same way. Thermal deformations in a plane parallel to the holding plane can be directly measured at the point of interest, i.e. at the exposure slit on the substrate. Thermal deformations in a direction perpendicular to the holding plane may still exist, but are typically a factor 10 less of importance for the lithographic process. This allows the use of materials different than materials with an extreme low thermal expansion coefficient, CTE, such as Zerodur. Instead, materials with a higher CTE, and a higher Young modulus or higher thermal conductance may be used, such as SiSiC. In an embodiment, the substrate table and the substrate table reference element are one monolithic part.

Alternatively or in addition with the embodiments described above, the lithographic apparatus may be provided with an additional position measurement system for measuring the position of at least part of the substrate table position measurement system relative to at least part the projection system position measurement system. An example of an additional position measurement system is an interferometer system to measure the position of the substrate position measurement system relative to the projection system position measurement system. For example, the interferometer system may measure the position of the sensor assembly 7 relative to the sensor head 1. Thermal deformation or vibrations of the sensor frame can be detected by the interferometer system and may thus be compensated for. The interferometer system may be an external interferometer system in which the interferometer beams go outside the sensor frame 3. The interferometer system may be an internal interferometer system in which the beams go through the sensor frame 3. The sensor frame 3 may be made at least partly hollow or provided with a transparent inner part, so the beams may go through. The internal interferometer system has the benefit that the beams can be shielded for disturbances, such as pressure waves. The external interferometer system may be provided with additional shielding against thermal, optical or sonic disturbances. Alternatively or in additional to the interferometer system, a spectral interference laser may be used.

Other examples of an additional position measurement system are an optical encoder system, an magnetic encoder system and a non-interferometer system. Examples of non-interferometer systems are triangulation, detection of an optical spot on at least one photodiode, or using CCD's.

A further example of an additional position measurement system is a strain-based measurement system. This system may comprise a strain-gauge located in or on the sensor frame 3.

In a further example of an additional position measurement system the sensor frame 3 may be provided with at least one optical fiber for transporting light. Deformation of the sensor frame 3 can cause deformation of the fiber and as a result a change in a property of the light through the fiber, such as polarization or intensity. This change can be measured by a suitable sensor.

In the embodiments described above, a further position measurement system may be provided to measure at the top side of the substrate the position of the substrate or substrate table in Z, Rx and/or Rz.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table comprising a holder configured to hold a substrate in a holding plane;
   a projection system configured to project, when the substrate table is positioned in an exposure area, a patterned radiation beam onto a target portion of the substrate;
   a substantially vibration isolated frame supporting the projection system,
   a substrate table position measurement system configured to measure a position of the substrate table, wherein said substrate table position measurement system comprises a substrate table reference element arranged on the substrate table, and
   a first sensor head configured to determine a position of the first sensor head with respect to the substrate table reference element, wherein said substrate table reference element extends in a measurement plane substantially parallel to the holding plane, and wherein said holding plane is arranged at one side of the measurement plane and the first sensor head is arranged, when the substrate table is in the exposure position, at an opposite side of the measurement plane,
   a sensor frame mounted on a sub-frame of the lithographic apparatus and wherein the first sensor head is mounted on the sensor frame;
   a projection system position measurement system configured to measure a position of the projection system, the projection system position measurement system comprising a projection system reference element and a sensor assembly to determine a position of the sensor assembly with respect to the projection system reference elements, and
   wherein one of the sensor assembly and the projection system reference element is mounted on the projection system, and the other one of the sensor assembly and the projection system reference element is mounted on the sensor frame.

2. The lithographic apparatus of claim 1, wherein said sub-frame is the substantially vibration isolated frame.

3. The lithographic apparatus of claim 1, wherein said sensor frame is mounted on the sub-frame by a statically determined construction.

4. The lithographic apparatus of claim 3, wherein the statically determined construction includes a statically determined leaf spring construction.

5. The lithographic apparatus of claim 1, comprising an additional position measurement system configured to measure the position of at least part of the substrate table position measurement system relative to at least part of the projection system position measurement system.

6. The lithographic apparatus of claim 1, wherein a lowest resonance frequency of the sensor frame is substantially higher than a lowest resonance frequency of the sub-frame.

7. The lithographic apparatus of claim 1, wherein a lowest resonance frequency of the sensor frame is at least 400 Hz.

8. The lithographic apparatus of claim 1, wherein the substrate table reference element and/or one or more projection system measurement elements comprise a grid or grating.

9. The lithographic apparatus of claim 1, wherein the first sensor head is configured to measure a position of the substrate table in six degrees of freedom and/or wherein the sensor assembly is configured to measure a position of the projection system in six degrees of freedom.

10. The lithographic apparatus of claim 1, wherein said first sensor head comprises a first and a second encoder sensor configured to measure a position in a first direction in the measurement plane, and a third encoder sensor configured to measure a position in a second direction in the measurement plane substantially perpendicular to the first direction, and wherein the first sensor head comprises three interferometer sensors configured to measure a position in a direction substantially perpendicular to the measurement plane.

11. The lithographic apparatus of claim 1, wherein the sensor assembly comprises a first position sensor configured to measure a position of the projection system in a radial direction with respect to the optical axis of the projection system, a second position sensor configured to measure a position of the projection system in a tangential direction with respect to the optical axis of the projection system, and a third position sensor configured to measure a position of the projection system in the radial direction or the tangential direction with respect to the optical axis of the projection system, and wherein the sensor assembly further comprises three further position sensors to measure a position in a direction substantially parallel to the optical axis of the projection system.

12. The lithographic apparatus of claim 1, wherein, in exposure position of the substrate table, the holding plane is arranged above the measurement plane and the first sensor head is arranged below the measurement plane.

13. The lithographic apparatus of claim 1, comprising one or more shielding frames comprising shielding material at least partially covering and/or enclosing the sensor frame, the first sensor head and/or the sensor assembly.

14. The lithographic apparatus of claim 1, comprising one or more passive and/or active dampers configured to damp of movements of the sensor frame.

15. The lithographic apparatus of claim 1, comprising one or more air conditioners configured to provide a conditioned air flow in a measurement area of measurement beams of the first sensor head and/or sensor assembly.

16. The lithographic apparatus of claim 1, comprising one or more thermal conditioners configured to perform a control thermal condition of the sensor frame.

17. The lithographic apparatus of claim 1, comprising a measuring area comprising an alignment sensor and one or more focus sensors configured to perform alignment and focus measurements when the substrate table is positioned in a measurement position, wherein the lithographic apparatus comprises a second sensor head configured to measure a position of the substrate table in the measurement position, a second sensor assembly configured to measure positions of the alignment sensor and the one or more focus sensors, and a second sensor frame configured to support the second sensor head and the second sensor assembly.

18. The lithographic apparatus of claim 1, wherein the substrate table reference element comprises the same material as at least the part of the substrate table.

19. The lithographic apparatus of claim 1, comprising an interferometer system configured to measure the position of the substrate position measurement system relative to the projection system position measurement system.

20. The lithographic apparatus of claim 1, comprising a further position measurement system configured to measure at a top side of the substrate the position of the substrate or substrate table in Z, Rx and/or Rz.

* * * * *